(12) United States Patent
Cheng et al.

(10) Patent No.: US 12,519,027 B2
(45) Date of Patent: Jan. 6, 2026

(54) EMBEDDED DIE PACKAGING OF POWER SEMICONDUCTOR DEVICES

(71) Applicant: Infineon Technologies Canada Inc., Ottawa (CA)

(72) Inventors: An-Sheng Cheng, Hsinchu (TW); Stephen Coates, San Francisco, CA (US)

(73) Assignee: Infineon Technologies Canada Inc., Ottawa (CA)

( * ) Notice: Subject to any disclaimer, the term of this patent is extended or adjusted under 35 U.S.C. 154(b) by 469 days.

(21) Appl. No.: 18/085,660

(22) Filed: Dec. 21, 2022

(65) Prior Publication Data
US 2024/0213110 A1 Jun. 27, 2024

(51) Int. Cl.
*H01L 23/522* (2006.01)
*H01L 21/48* (2006.01)
(Continued)

(52) U.S. Cl.
CPC ...... *H01L 23/3192* (2013.01); *H01L 21/4828* (2013.01); *H01L 21/56* (2013.01);
(Continued)

(58) Field of Classification Search
CPC .............. H01L 21/4828; H01L 21/56; H01L 21/76807; H01L 21/4814; H01L 21/50; H01L 21/60; H01L 23/3192; H01L 23/293; H01L 23/3171; H01L 23/49513; H01L 23/5226; H01L 23/5283; H01L 23/49805; H01L 24/32; H01L 21/561; H01L 21/568; H01L 21/76801; H01L 21/76802; H01L 21/76838; H01L 21/76877; H01L 21/76883; H01L 23/49562; H01L 23/3107; H01L 23/3135; H01L 23/49503;
(Continued)

(56) References Cited

U.S. PATENT DOCUMENTS

| | | | |
|---|---|---|---|
| 6,946,325 B2 * | 9/2005 | Yean | H01L 23/5389 438/464 |
| 7,993,972 B2 * | 8/2011 | Lin | H01L 24/73 438/109 |

(Continued)

*Primary Examiner* — Omar F Mojaddedi
(74) *Attorney, Agent, or Firm* — WORKMAN NYDEGGER

(57) ABSTRACT

Embedded die packaging for semiconductor power switching devices, wherein the package comprises a laminated body comprising a layer stack of a plurality of dielectric layers and conductive metal layers. A thermal contact area on a back-side of the die is attached to a leadframe. A patterned layer of conductive metallization on a front-side of the die provides electrical contact areas of the power semiconductor device. Before embedding, a protective dielectric layer is provided on the front-side of the die, extending around edges of the die. The protective dielectric layer provides a protective region that acts a cushion to protect edges of the die from damage during lamination. The protective dielectric material may extend over the electrical contact areas to protect against etch damage and damage during laser drilling of vias, thereby mitigating physical damage, overheating or other potential damage to the active region of the semiconductor device.

20 Claims, 10 Drawing Sheets

(51) Int. Cl.
*H01L 21/56* (2006.01)
*H01L 21/60* (2006.01)
*H01L 21/768* (2006.01)
*H01L 23/00* (2006.01)
*H01L 23/29* (2006.01)
*H01L 23/31* (2006.01)
*H01L 23/495* (2006.01)
*H01L 23/528* (2006.01)
*H10D 30/47* (2025.01)
*H10D 64/01* (2025.01)
*H10D 64/23* (2025.01)

(52) U.S. Cl.
CPC ........ *H01L 23/293* (2013.01); *H01L 23/3171* (2013.01); *H01L 23/49513* (2013.01); *H01L 23/49562* (2013.01); *H01L 23/5226* (2013.01); *H01L 23/5283* (2013.01); *H01L 24/32* (2013.01); *H10D 64/01* (2025.01); *H10D 64/258* (2025.01); *H01L 2224/32225* (2013.01); *H01L 2924/1033* (2013.01); *H01L 2924/13064* (2013.01)

(58) Field of Classification Search
CPC ... H01L 23/49517; H01L 23/14; H01L 23/29; H01L 23/3114; H01L 23/485; H01L 23/495; H01L 23/49811; H01L 23/49827; H01L 23/49844; H01L 23/528; H10D 64/01; H10D 64/258; H10D 30/47
See application file for complete search history.

(56) References Cited

U.S. PATENT DOCUMENTS

| | | | |
|---|---|---|---|
| 11,342,248 | B2 | 5/2022 | Mcknight-Macneil et al. |
| 11,476,188 | B2 | 10/2022 | Mcknight-Macneil |
| 2014/0175454 | A1* | 6/2014 | Roberts ............. H01L 23/49562 257/76 |
| 2016/0240471 | A1* | 8/2016 | Klowak ................. H10D 30/60 |
| 2019/0013288 | A1* | 1/2019 | Kim ..................... H01L 23/4334 |
| 2022/0020669 | A1 | 1/2022 | Mcknight-Macneil et al. |
| 2022/0115319 | A1 | 4/2022 | Mcknight-Macneil |
| 2022/0246503 | A1 | 8/2022 | Mcknight-Macneil et al. |
| 2023/0019052 | A1 | 1/2023 | Mcknight-Macneil et al. |

\* cited by examiner

Cross-section A-A

Cross-section B-B
(through source region)

800-4

800-5

800-6

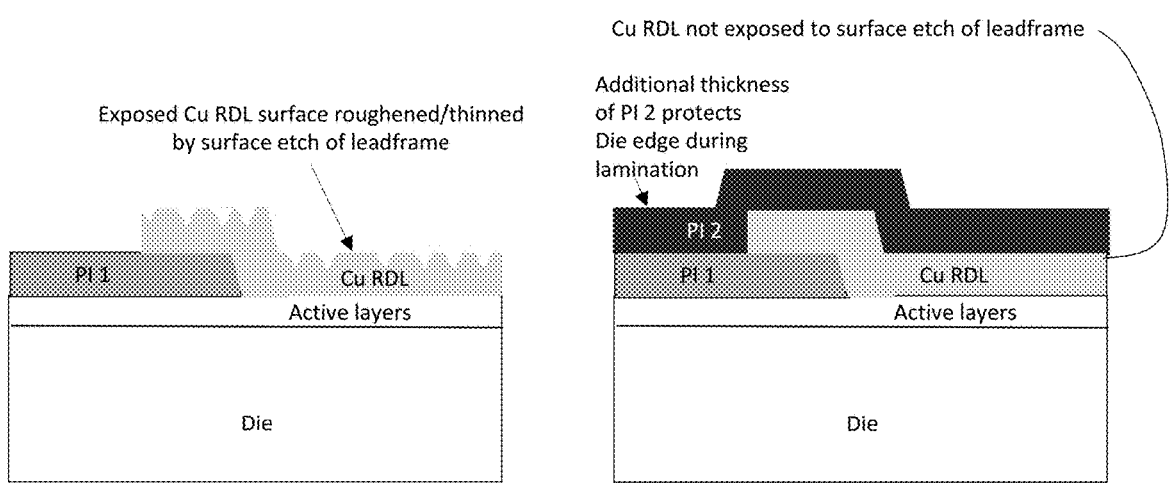
Fig. 9A
Fig. 10A
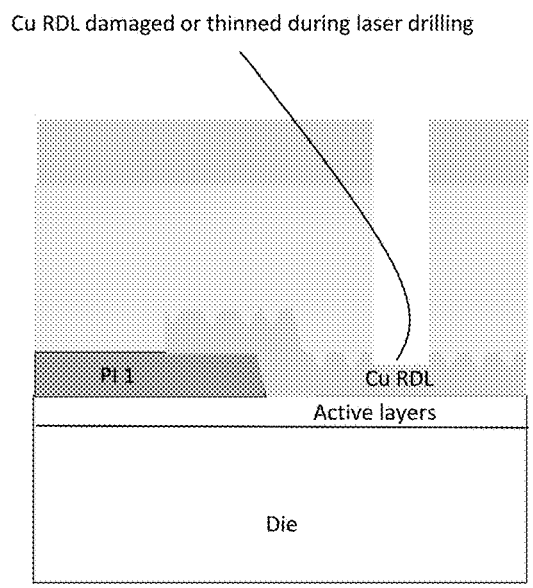
Fig. 9B
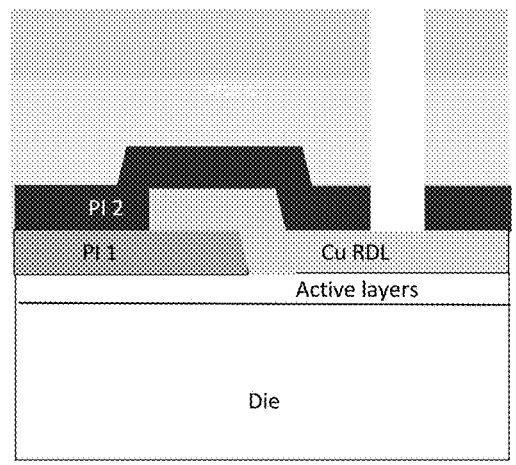
Fig. 10B

EMBEDDED DIE PACKAGING OF POWER SEMICONDUCTOR DEVICES

CROSS-REFERENCE TO RELATED APPLICATION(S)

This application is related to U.S. patent application Ser. No. 17/945,231, filed Sep. 15, 2022, entitled "Fabrication of Embedded Die Packaging comprising Laser Drilled Vias", which is a continuation-in-part of U.S. patent application Ser. No. 17/065,886, filed Oct. 8, 2020, entitled "Fabrication of Embedded Die Packaging comprising Laser Drilled Vias"; both applications are incorporated herein by reference in their entirety.

This application is related to U.S. patent application Ser. No. 17/728,220 filed Apr. 25, 2022, entitled "Embedded Die Packaging for Power Semiconductor Devices", which is a continuation of U.S. patent application Ser. No. 16/928,305, filed Jul. 14, 2020, of the same title; both applications are incorporated herein by reference in their entirety.

This application is related to United States patent application no. provisional patent application no. 63/350,562, filed Jun. 9, 2022, entitled "Dual Side-Cooled Embedded Die Packaging for Power Semiconductor Devices", which is incorporated herein by reference in its entirety.

TECHNICAL FIELD

This invention relates to embedded die packaging for power semiconductor devices, for example, lateral GaN semiconductor power transistors for high-voltage, high-current applications.

BACKGROUND

The above-referenced related patent applications disclose examples of embedded die packaging for power semiconductor devices based on a laminated package body comprising a plurality of dielectric layers and electrically conductive metal layers, in which internal electrical connections between a power semiconductor die and conductive metal layers are made with conductive vias and/or microvias extending through the dielectric layers.

GaN power transistors, such as GaN HEMTs, provide for high current, high voltage operation combined with high switching frequency. For some power applications, GaN power devices and systems offers advantages over silicon technology using Si IGBTs and diodes and SiC power transistors and diodes. For example, power switching systems comprising lateral GaN transistors provide higher efficiency switching, with lower losses, and smaller form factor than comparable systems based on silicon or SiC technology. To benefit from the inherent performance characteristics of lateral GaN transistors, important design considerations include, e.g.: device layout (topology), low inductance interconnect and packaging, and effective thermal management. Lateral GaN power transistors for high current operation at 100V and 650V operation are currently available from GaN Systems Inc. based on Island Technology® that provides a large gate width $W_g$, low on-resistance, $R_{on}$, and high current capability per unit active area of the device.

Embedded die packaging solutions offer low inductance interconnections, and low thermal impedance, are disclosed, for example, in U.S. patent application Ser. No. 16/928,305, filed Jul. 14, 2020, entitled "Embedded Die Packaging for Power Semiconductor Devices", references cited therein, and non-patent publications relating to GaNPx® embedded die packaging. U.S. Ser. No. 16/928,305 discloses embedded die packaging for power semiconductor devices which comprises a laminated structure built up from layers of dielectric materials and conductive metal layers. This type of laminated embedded die packaging provides low parasitic inductance in a compact (i.e. small form factor) package for high voltage, high current GaN e-HEMTs.

GaN power switching devices, such as those offered by GaN Systems Inc., which are embedded in a GaNPx type laminated package of small size, e.g. 7 mm×5 mm and 0.5 mm thick, are capable of operation at voltages in a range from, e.g. 100V to 650V, for switching currents of e.g. tens or hundreds of Amps. Operating temperatures may reach or exceed 100 C. For small size dies having a high current capability per unit active area, and smaller package sizes, e.g. chip-scale packaging, package components are therefore subjected to higher electric fields and higher operating temperatures than for low voltage, lower power switching devices.

As disclosed in the above-referenced related patent documents, mismatch of thermal coefficient of expansion (CTE) between the conductive metal layers and dielectric build-up layers of a laminated embedded die package may lead to interlayer stresses, and potential cracking, crack propagation and delamination during the lamination process to form the embedded die package, and/or during subsequent operational thermal cycling. Embedded die packaging that currently meets or exceeds qualification criteria for less harsh applications may not pass qualification for harsher operating conditions, e.g. qualification to meet more stringent testing and qualification, e.g. for current and future automotive applications. For example, during the lamination process, significant pressure is applied to the layer stack, with heat to provide curing of the dielectric build-up layers. During subsequent laser drilling of vias through the dielectric layers, which are then filled with conductive material, to provide electrically conductive interconnect vias and thermally conductive vias, it is possible that the contact areas within the laser drilled vias, and underlying active layers of the semiconductor device may be subject to thermal and mechanical damage.

There is a need for improved or alternative embedded die packaging structures and methods of fabrication, e.g. particularly for high voltage/high current power switching semiconductor devices, such as lateral GaN HEMTs, to provide improved reliability to meet more stringent testing and qualification, e.g. for automotive applications.

SUMMARY OF INVENTION

The present invention seeks to provides improved or alternative embedded die packaging for power semiconductor devices, particularly for high voltage/high current widebandgap semiconductor power switching devices, e.g. lateral GaN HEMTs, which mitigate or circumvent at least one of the above-mentioned issues.

Aspects of the invention provide embedded die packaging for semiconductor power switching devices, wherein a die is embedded in a package comprising a laminated body comprising a layer stack of a plurality of dielectric layers and conductive metal layers; a thermal contact area on a back-side of the die is attached to a leadframe; a patterned layer of conductive metallization on a front-side of the die provides electrical contact areas of the semiconductor power switching device; a protective dielectric layer is provided on the front-side of the die, extending around edges of the die forming a protective region around a periphery of the die that acts a cushion to protect edges of the die from damage during lamination.

The protective dielectric material may extend over the electrical contact areas to protect against etch damage and damage during laser drilling of vias, thereby mitigating physical damage, overheating or other potential damage to the active region of the semiconductor device. In example embodiments, the protective dielectric material comprises a material such as a polyimide, which is compressible, resistant to leadframe surface roughening etch processes, and can be removed during laser drilling of vias.

One aspect provides a method of post-processing a semiconductor die comprising a GaN semiconductor switching power device prior to embedded die packaging comprising:
providing the semiconductor die comprising a patterned layer of conductive metallization on a front-side of the die providing electrical contact areas of the power semiconductor switching device comprising a source contact, a drain contact and a gate contact;
providing a first dielectric layer extending over the front-side of the die;
defining contact openings through the first dielectric layer to electrical contact areas of the power semiconductor device;
providing a conductive metal redistribution layer on the first dielectric layer extending through the contact openings of the first dielectric layer;
patterning the conductive metal redistribution layer to provide a source contact area, a drain contact area and a gate contact area;
providing a protective second dielectric layer extending over the first dielectric layer and the source contact area, drain contact area and gate contact area of the conductive metal redistribution layer;
the protective second dielectric layer masking each of the source contact area, drain contact area and gate contact area of the conductive metal redistribution layer, and the protective second dielectric layer extending to edges of the die to form a protective region extending around a periphery of the die.

A second aspect provides a semiconductor device structure comprising:
a die comprising a GaN semiconductor power switching device having a patterned layer of conductive metallization on a front-side of the die providing electrical contact areas of the semiconductor power switching device comprising a source contact, a drain contact and a gate contact;
a first dielectric layer extending over the front-side of the die;
contact openings through the first dielectric layer to said source, drain and gate contact areas of the semiconductor power switching device;
a conductive metal redistribution layer formed on the first dielectric layer extending through the contact openings of the first dielectric layer;
the conductive metal redistribution layer being patterned to provide a source contact area, a drain contact area and a gate contact area;
a protective second dielectric layer extending over the first dielectric layer and the source contact area, drain contact area and gate contact area of the conductive metal redistribution layer;
the protective second dielectric layer masking each of the source contact area, drain contact area and gate contact area, and the protective second dielectric layer extending to edges of the die to form a protective region extending around a periphery of the die.

For example, the protective second dielectric layer comprises a polyimide material having a thickness and mechanical properties whereby the protective region extending around the periphery of the die is configured to act as a cushion during embedded die packaging.

The protective second dielectric layer may be provided as a blanket layer over the front-side of the die. The protective second dielectric layer is provided selectively on the front-side of the die to define said protective region extending around the periphery of the die, and to mask each of the source contact area, drain contact area and gate contact area of the conductive metal redistribution layer.

A third aspect provides a method of leadframe embedded die packaging of a semiconductor die comprising a GaN semiconductor power switching device comprising: providing the semiconductor die comprising a patterned layer of conductive metallization on a front-side of the die providing electrical contact areas of the GaN semiconductor power switching device comprising a source contact, a drain contact and a gate contact; providing a first dielectric layer extending over the front-side of the die;
defining contact openings through the first dielectric layer to electrical contact areas of the power semiconductor device;
providing a conductive metal redistribution layer on the first dielectric layer extending through the contact openings of the first dielectric layer;
patterning the conductive metal redistribution layer to provide a source contact area, a drain contact area and a gate contact area;
providing a protective second dielectric layer extending over the first dielectric layer and the source contact area, drain contact area and gate contact area of the conductive metal redistribution layer;
the protective second dielectric layer masking each of the source contact area, drain contact area and gate contact area of the conductive metal redistribution layer, and the protective second dielectric layer extending to edges of the die to form a protective region extending around a periphery of the die;
providing a leadframe and mounting the die on the leadframe with die attach material;
performing a surface roughening etch on the leadframe, wherein the protective second dielectric layer is etch-resistant to the surface roughening etch;
providing a layer stack comprising:
the leadframe and the die mounted on the leadframe;
a plurality of dielectric build-up layers and at least one conductive layer;
performing a lamination process to embed the die and at least top and side surfaces of the leadframe;
opening vias for electrical contacts to the die by laser drilling through the dielectric build-up layers, through the at least one conductive layer, and through the protective second dielectric layer;
filling the vias with conductive metal;
patterning the at least one conductive layer for form source, drain and gate interconnect;
providing another dielectric build-up layer over said at least one conductive layer.

For example, the protective second dielectric layer comprises a polyimide material having a thickness and mechanical properties whereby the protective region extending around the periphery of the die is configured to function as a cushion during embedded die packaging.

The protective second dielectric layer may be provided as a blanket layer over the front-side of the die. The protective second dielectric layer may be provided selectively on the front-side of the die to define said protective region extending around the periphery of the die, and to mask each of the source contact area, drain contact area and gate contact area of the conductive metal redistribution layer.

Another aspect provides an embedded die package comprising a laminated body and a die comprising a GaN semiconductor power switching device embedded within the laminated body, wherein:
- the die comprising the semiconductor power switching device has a patterned layer of conductive metallization on a front-side of the die providing electrical contact areas of the GaN semiconductor power switching device comprising a source contact, a drain contact and a gate contact;
- a first dielectric layer extending over the front-side of the die;
- contact openings through the first dielectric layer to said source, drain and gate contact areas of the semiconductor power switching device;
- a conductive metal redistribution layer formed on the first dielectric layer extending through the contact openings of the first dielectric layer;
- the conductive metal redistribution layer being patterned to provide a source contact area, a drain contact area and a gate contact area;
- a protective second dielectric layer extending over the first dielectric layer and the source contact area, drain contact area and gate contact area of the conductive metal redistribution layer;
- the protective second dielectric layer extending over each of the source contact area, drain contact area and gate contact area, and the protective second dielectric layer extending to edges of the die to form a protective region extending around a periphery of the die; the laminated body comprises a layer stack comprising at least one dielectric layer that embeds the die and at least top and side surfaces of the leadframe, and a first conductive layer patterned to define interconnect areas;
- a plurality of electrically conductive vias extending through the first conductive layer, the at least one dielectric layer that embeds the die, and the protective second dielectric layer, the plurality of electrically conductive vias interconnecting interconnect areas of the first conductive layer and electrical contact areas of the semiconductor device.

The protective second dielectric layer comprises a polyimide material having a thickness and mechanical properties whereby the protective region extending around the periphery of the die forms a cushion during embedded die packaging. The protective second dielectric layer may be provided as a blanket layer over the front-side of the die. The protective second dielectric layer is provided selectively on the front-side of the die to define said protective region extending around the periphery of the die, and to mask each of the source contact area, drain contact area and gate contact area of the conductive metal redistribution layer. In example embodiments, the protective second dielectric material may comprise a polyimide material which is resistant to a surface roughening etch of the conductive metal redistribution layer and metal of the leadframe. For example, the conductive metal redistribution layer and the leadframe comprise copper, and the protective second dielectric material comprises a polyimide material which is resistant to a surface roughening etch of the conductive metal redistribution layer and metal of the leadframe.

Thus, embedded die packages of example embodiments provide for improvements in embedded die packaging for power semiconductor switching devices, such as lateral GaN semiconductor power transistors. Embedded die packages of example embodiments provide for packaging of high voltage and high current power switching devices, e.g. for improved device performance and reliability.

BRIEF DESCRIPTION OF THE DRAWINGS

FIGS. 9A and 9B show schematic enlarged cross-sectional views of part of the embedded die package of the first embodiment before and after embedding, and laser drilling of a via;

FIGS. 10A and 10B show schematic enlarged cross-sectional views of part of the embedded die package of the second embodiment before and after embedding, and laser drilling of a via;

Figures 1A, 1B, 1C:
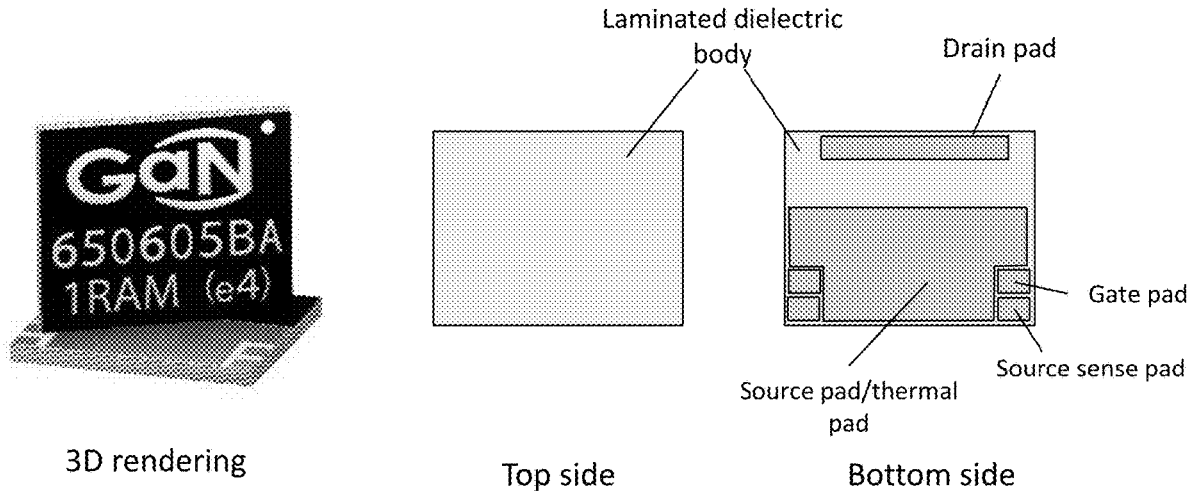
FIG. 1A (Prior Art) shows 3D rendering of an example of an embedded die package comprising a E-mode lateral GaN HEMT device structure embedded in a laminated dielectric body with a bottom-side thermal pad.
FIGS. 1B and 1C show schematic top-side and bottom-side views of the embedded die package shown in FIG. 1A.

The foregoing and other features, aspects and advantages of the present invention will become more apparent from the following detailed description, taken in conjunction with the accompanying drawings, of example embodiments of the invention, which description is by way of example only.

DETAILED DESCRIPTION

Background information on packaging of power semiconductor devices, packaging solutions that offer low inductance interconnections is disclosed, for example, in the Applicant's earlier filed patent documents: U.S. patent application Ser. No. 15/027,012, filed Apr. 15, 2015, now U.S. Pat. No. 9,659,854, entitled "Embedded Packaging for Devices and Systems Comprising Lateral GaN Power Transistors"; U.S. patent application Ser. No. 15/064,750, filed Mar. 9, 2016, now U.S. Pat. No. 9,589,868, entitled "Packaging Solutions for Devices and Systems Comprising Lateral GaN Power Transistors"; U.S. patent application Ser. No. 15/064,955, filed Mar. 9, 2016, now U.S. Pat. No. 9,589,869, entitled "Packaging Solutions for Devices and Systems Comprising Lateral GaN Power Transistors"; and U.S. patent application Ser. No. 15/197,861, filed Jun. 30, 2016, now U.S. Pat. No. 9,824,949, entitled "Packaging Solutions for Devices and Systems Comprising Lateral GaN Power Transistors".

As described herein, "embedded die packaging" refers to package structures in which a power semiconductor die, e.g. comprising a lateral GaN HEMT, is embedded in a dielectric package body, e.g.: a dielectric polymer resin composition, such as a glass fiber epoxy composite, which may be an FR4 type material. Conductive interconnects through the dielectric layers are provided, e.g., by copper traces, posts and vias, that provide low inductance interconnections to external contact pads (lands) for source, drain and gate connections.

For example, in embedded die packaging as described in U.S. patent application Ser. No. 16/928,305, entitled "Embedded Die Packaging for Power Semiconductor Devices" filed Jul. 14, 2020 (now U.S. Pat. No. 11,342,248), the body of the package is a laminated structure built-up from layers of dielectric and layers of electrically conductive materials. This type of laminated embedded die packaging provides low parasitic inductance in a compact (i.e. small form factor) package for high voltage, high current GaN HEMTs.

The dielectric polymer resin composition forming the dielectric layers of laminated embedded die packaging may include laminate sheets and layers of composite material referred to as prepreg, which is a substrate material, such as woven or non-woven glass-fiber cloth, which is pre-impregnated with one or more polymer materials, such as a dielectric epoxy composition. The dielectric epoxy composition may comprise an epoxy resin, curing agents, additives, such as fire retardants, and fillers and other substances to modify properties of the resulting composite material. One or more pre-cured epoxy laminate sheets and/or uncured prepreg layers are cut to form a cavity for the semiconductor die, with or without a leadframe, and sandwiched between other uncured prepreg layers, i.e. assembled as a layer stack (which may be referred to as a layup), and the layers are then bonded together in a press, e.g. in a curing process using heat and pressure, to form a laminated dielectric body of the package in which the semiconductor die, or the semiconductor die and leadframe, is embedded.

For power semiconductor devices, a typical embedded die package comprises low inductance electrical interconnect layers and conductive vias, e.g. formed from plated copper, and a thermal pad, which may be provided by a leadframe or formed from plated copper. The outer layers of an embedded package comprise an isolation layer which is a coating of a material that provides an electrically insulating and protective outer covering over the underlying dielectric and conductive layers, e.g. the outer dielectric layer covers underlying layers including copper source, drain and gate interconnect traces, and openings are provided in the outer dielectric layer for the external source, drain and gate contact areas, and for the thermal pad.

Figures 2A, 2B, 2C:
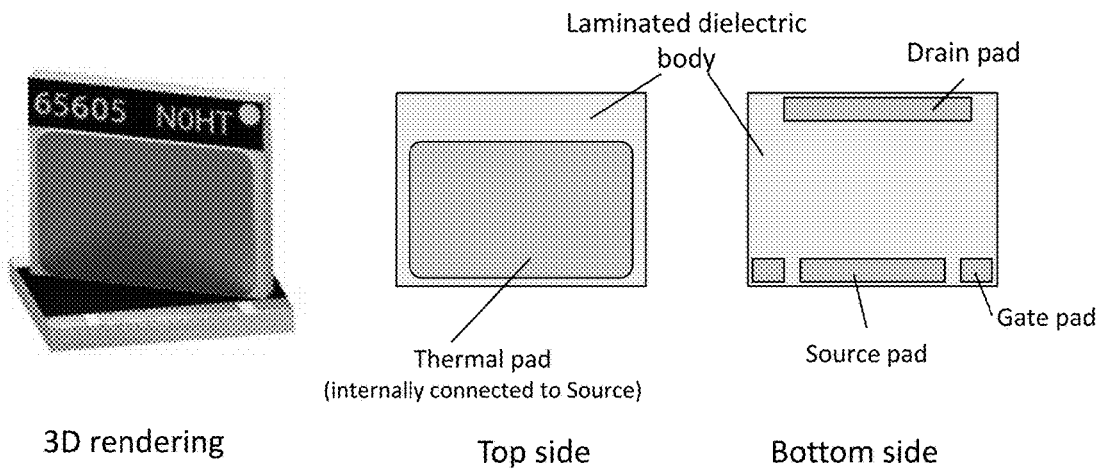
FIG. 2A (Prior Art) shows 3D rendering of an example of an embedded die package comprising a E-mode lateral GaN HEMT device structure embedded in a laminated dielectric body with a top-side thermal pad.
FIGS. 2B and 2C show schematic top-side and bottom-side views of the embedded die package shown in FIG. 2A.

Examples of embedded die packaging device structures comprising a laminated dielectric body containing a lateral GaN power transistor are shown schematically in FIGS. 1A, 1B and 1C and FIGS. 2A, 2B and 2C. FIG. 1A shows top-side and bottom-side 3D views of a first example of a package comprising an embedded GaN-on-Si die comprising a 650V lateral GaN e-HEMT. As shown in FIG. 1B, the top-side of the package comprises an exposed layer of dielectric of the laminated dielectric body, and as shown in FIG. 1C, the bottom side of the package comprises a source pad/thermal pad, a drain pad, and source sense and gate contact pads. This type of package, where the electrical contact pads and thermal pad are provided on the same side of the package is referred to as a bottom-side cooled embedded package, or B-type embedded die package. FIG. 2A shows top-side and bottom-side 3D views of another example of a package comprising an embedded GaN-on-Si die comprising a lateral GaN e-HEMT. As shown in FIG. 2B, the top-side of the package comprises a thermal pad, which is internally connected to source. As shown in FIG. 2C, the source, drain and gate contact pads are provided on a bottom-side of the package. This type of package, where the electrical contact pads are provided on one side of the package and the thermal pad is provided on the opposite side, is referred to as a top-side cooled embedded package, or T-type embedded die package. If required, thermal pads may be provided on both the top-side and bottom-side of the package, as described in the above referenced U.S. provisional patent application No. 63/350,562.

Figure 3:
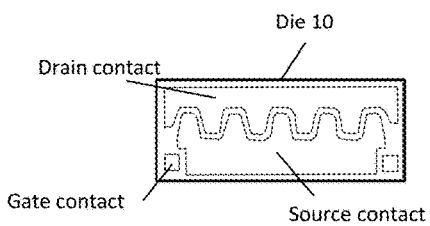
FIG. 3 shows a schematic top plan view of a semiconductor die comprising an E-mode lateral GaN HEMT of an example embodiment, to illustrate a device topology with large area source and drain contact areas and dual gate contact areas.

FIG. 3 shows a schematic top plan view of an example power semiconductor die comprising a lateral GaN power transistor, wherein the die comprises a thick plated copper redistribution layer (RDL), which defines large area source and drain contact areas (source pad and drain pad) and dual gate contact areas (gate pads), on the top side (active side) of the die. For example, the die comprises a silicon substrate, and an epi-layer stack is formed thereon comprising a GaN/AlGaN hetero-layer structure defining a two-dimensional electron gas (2DEG) active layer of a lateral GaN power transistor, such as an E-mode GaN HEMT. An interconnect structure comprises a plurality of conductive metallization layers and dielectric layers, wherein a top metallization layer defines external source, drain and gate contact areas of the lateral GaN power transistor on a front-side of die. A back-side of the die comprises a thermal pad.

Figure 4:
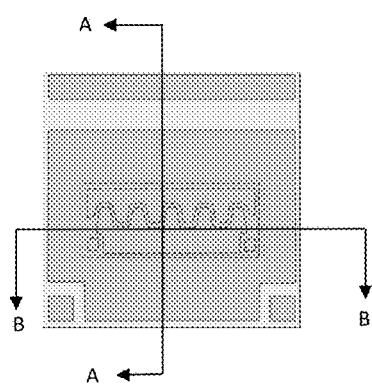
FIG. 4 shows a plan view of the bottom side of a bottom-cooled embedded die package of a first example embodiment.

FIG. 4 shows a schematic plan view of an embedded die package of a first example embodiment. The internal position of the embedded die is shown in dotted outline. As an example, the outline of the package may be square or rectangular, e.g. having external dimensions of ~10 mm×~10 mm or ~5 mm×~10 mm.

Figure 5A:
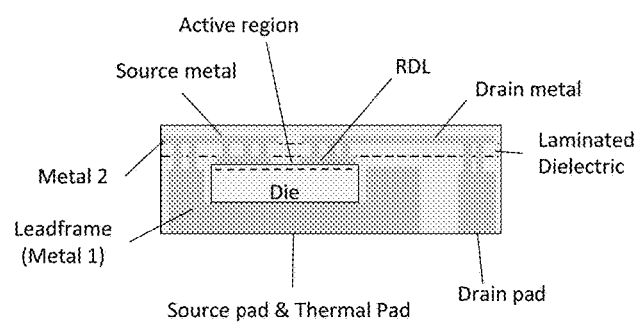
FIG. 5A shows a schematic cross-sectional view through plane A-A of FIG. 4 to illustrate the laminated multilayer structure of the bottom-cooled embedded die package of the first example embodiment.
Figure 5B:
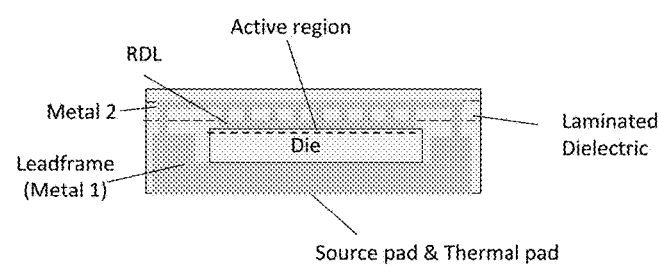
FIG. 5B shows a schematic cross-sectional view through plane B-B of FIG. 4 to illustrate the laminated multilayer structure of the bottom-cooled embedded die package of the first example embodiment.

FIGS. 5A and 5B show schematic cross-sectional views, through sections A-A and B-B, respectively of FIG. 4 to illustrate an example internal layer structure. The embedded die package comprises a laminated dielectric body comprising an epoxy composition fabricated from laminations comprising several epoxy laminate and prepreg layers (light green) and conductive copper layers (copper color). In this embodiment, there are two conductive metal layers (Metal 1 and Metal 2). The die is mounted on a leadframe (Metal 1). The active region of the die (front or top-side of the die) is facing upwards in this view, and the back-side of the die is attached in thermal contact with the leadframe. Metal 2 is patterned to define source and drain connections (source metal and drain metal), and gate connections (not shown in this view). Electrical interconnections between metals layers 1 and 2 are provided by drilling of vias which are then filled with electrically conductive material. For example, these components may comprise low inductance conductive copper interconnects comprising copper filled vias or copper filled micro-vias. Portions of the leadframe provide the external source, drain and gate pads on a bottom-side of the package. External surfaces of the source, drain and gate pads and thermal pads may be provided with a plating of e.g. nickel and gold, to facilitate surface mounting of the embedded die package, e.g. by soldering, or other processing.

In FIGS. 4, 5A and 5B, as in other Figures, it will be appreciated that layer thicknesses and lateral dimensions are shown schematically, and are not drawn to scale; the lateral patterning of shapes of the metal layers are shown as rectangular shapes, by way of example only. For example, in the plan view of FIG. 4, in practice, internal and external corners of the source, drain and gate contact areas may be 90 degrees as shown schematically, or radiused to avoid sharp corners.

For simplicity, FIGS. 4, 5A and 5B show a layup with only two metal layers. In other embodiments, additional dielectric layers and conductive layers may be provided, with symmetric and asymmetric layups, with and without a leadframe, e.g. as disclosed in U.S. Ser. No. 16/298,305 referenced above.

FIG. 6A to 6F shows schematic cross-sectional views to illustrate steps for fabrication of an embedded die package of the first example embodiment.

Figure 6A:
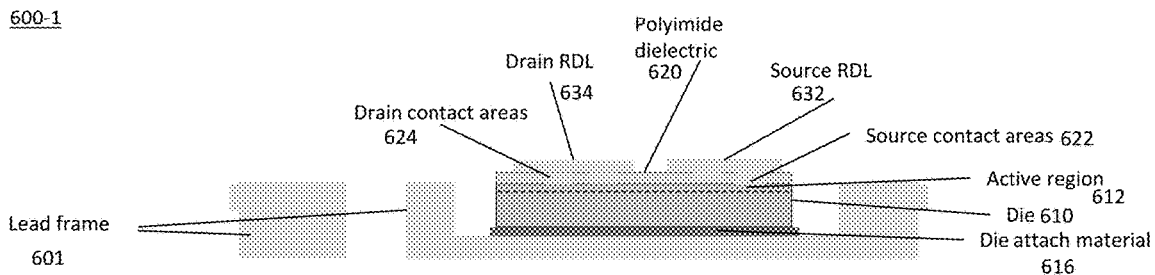
FIGS. 6A to 6F show schematic cross-sectional views to illustrate steps for fabrication of the embedded die package of the first example embodiment.

FIG. 6A shows a schematic cross-sectional view 600-1 of a leadframe 601 with a power semiconductor die 610 mounted on the leadframe 601. The power semiconductor die is a lateral GaN HEMT having source contact areas 622, drain contact areas 624, and gate contact areas (not shown in this view) formed on the active region 612, on the top-side of the die. During post-processing, prior to packaging, a dielectric layer 620, e.g. polyimide dielectric is provided on a top surface of the die and contact opening are made for the source, drain and gate. A plated copper (Cu) redistribution layer (RDL) is then provided and patterned to define a source RDL 632 contact area, a drain RDL 632 contact area, and gate RDL contact areas. The back-side of the die 610 is attached to the leadframe 601 with a layer of die attach material 616, e.g. silver sintering epoxy, or other suitable material. The assembly of the leadframe 601 and die 610 is then subject to an etching process for surface roughening of the leadframe to promote adhesion of the package dielectric. During the surface roughening process, the Cu RDL is also exposed to the etch process resulting in surface roughening and thinning of the Cu RDL.

Figure 6B:
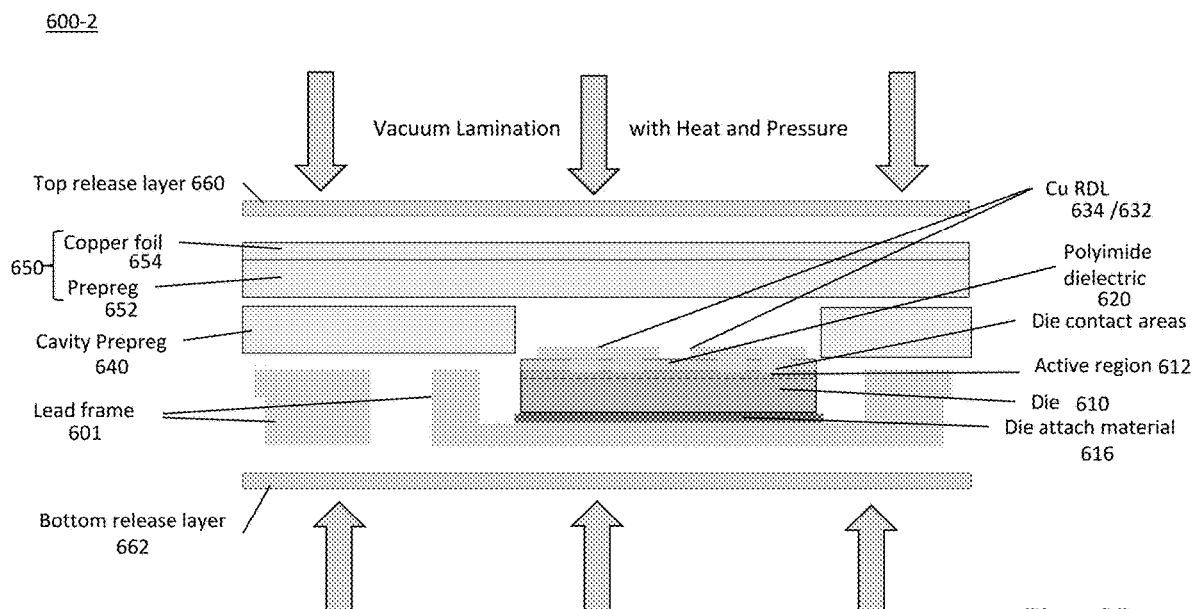
Figure 6C:
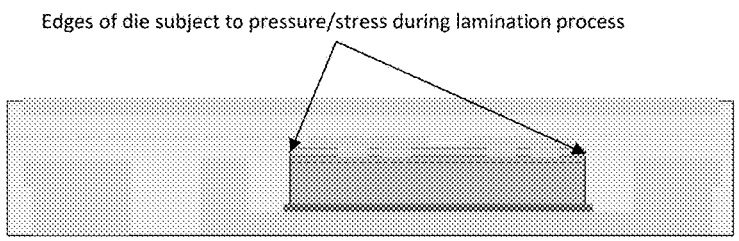

FIG. 6B shows a schematic cross-sectional view of the layer stack (layup) 600-2 of a bottom-cooled embedded die package of the first example embodiment, prior to lamination. The die 610 is mounted on the leadframe 601, as illustrated in FIG. 6A, and sandwiched between a cavity prepreg layer 640, a cover prepreg layer 650 comprising a dielectric layer 652 and a conductive copper foil layer 654, a top release layer 660 and a bottom release layer 662. The layer stack is then processed by a vacuum lamination process with application of pressure and heat. The dielectric layer of the cavity pre-preg comprises a glass fiber fabric impregnated with dielectric resin. During pressing and heating the dielectric resin of the cavity pre-preg flows into the cavities around between the die and the leadframe to fill the space and the cover pre-preg is bonded to the cavity pre-preg. After lamination, the top and bottom release layers are removed. FIG. 6C shows a schematic cross-sectional view of layers 600-3 of the bottom-cooled embedded die package after lamination.

Prior to the lamination process illustrated schematically in FIG. 6B, the leadframe, with the die attached as shown in FIG. 6A, is subjected to an etch process to roughen the metal surfaces of the leadframe and contact areas of the die, to promote adhesion of the resin of the package dielectric. For example, for a copper leadframe and copper RDL contact areas on the die, the etch process may be a brown oxide etch process.

Figure 6D:
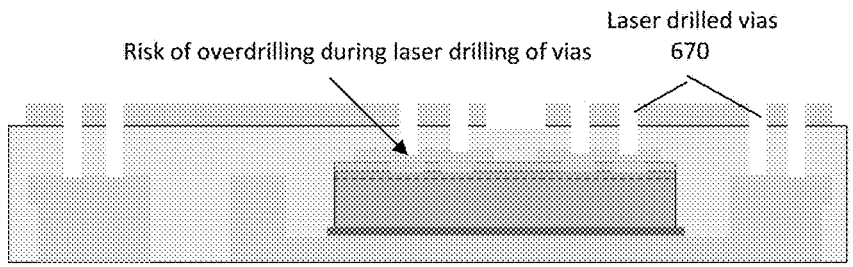
Figure 6E:
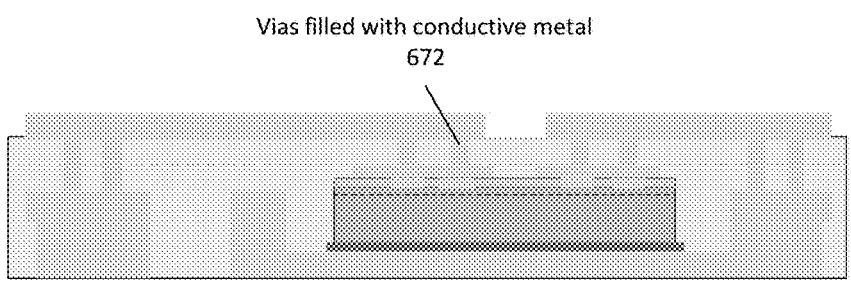

FIG. 6D shows a schematic cross-sectional view 600-4 of layers of the bottom-cooled embedded die package of the first example embodiment, after laser drilling of vias 670, and FIG. 6E shows a schematic cross-sectional view 600-5 of layers of the bottom-cooled embedded die package of the first example embodiment, after vias are filled with conductive metal 672.

Figure 6F:
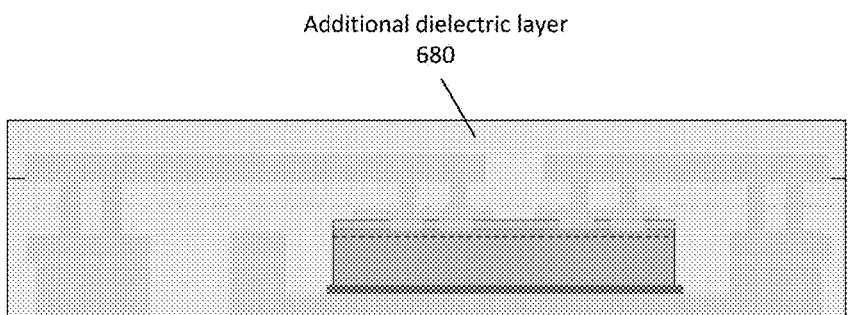

FIG. 6F shows a schematic cross-sectional view of layers of the bottom-cooled embedded die package of the first example embodiment after a subsequent lamination step to provide a top dielectric layer 680 comprising another prepreg layer. Alternatively the additional top dielectric layer may comprise a layer of solder resist, or another prepreg layer and a layer of solder resist.

Figure 7:
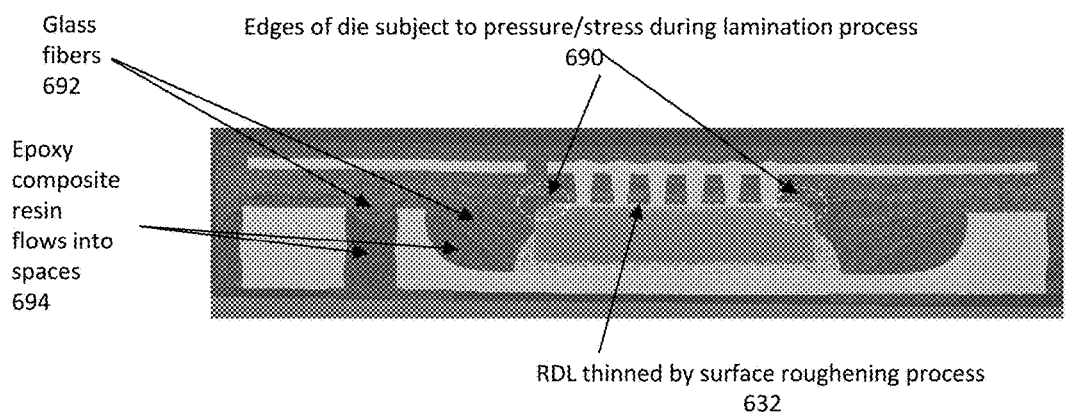
FIG. 7 shows an electron micrograph cross-section of an example embedded die package.

FIG. 7 shows an electron micrograph cross-section of an example embedded die package, fabricated by a lamination process as illustrated schematically in FIGS. 6A to 6F. The cross-sectional view of the device structure shown in FIG. 7, illustrates how the glass fibers of the cavity prepreg are deformed during pressing and how the epoxy resin of the cavity prepreg flows to fill the cavities around the leadframe and die to embed the die and embed at least upper and side surfaces of the leadframe. In this example device structure, a) the Cu RDL providing the source and drain contacts, e.g. source contact 632 visible in this view, is thinned and roughened during the surface roughening etch of the leadframe prior to lamination; and b) the edges of the die which are subject to significant pressure and heat, and therefore may be stressed, during the lamination process, which can potentially result in cracking of the top dielectric layers around the edges of the die. Thinning and roughening of the Cu RDL forming the contact areas on the die can lead to problems during laser drilling of vias, e.g. overdrilling can lead to thermal or mechanical damage to the active region of the power semiconductor die. These issues may be exacerbated for embedded die packaging of power semiconductor devices comprising lateral GaN HEMTs for high voltage/ high current applications, which are rated for operational temperatures ≥75° C. and are required to pass qualification for harsher operational conditions, e.g. for automotive applications. These issues may be mitigated by one or more of: a) providing a sufficiently thick layer of copper RDL to define the source, drain and gate contact areas; b) providing a sufficiently thick polyimide dielectric layer underlying the thick copper RDL; and c) careful control of the laser drilling process and energy, to avoid overdrilling and thermal damage to the active areas of the die. Required thicknesses of the copper RDL and polyimide layer may depend on the surface topology of the power semiconductor die. For example, in a fabrication process of an example embodiment: the polyimide layer is provided with a thickness to protect edges of the die during the lamination process, e.g. ≥10 μm; and the copper RDL is provided with a thickness, e.g. ≥8 μm, so that after etching for surface roughening, a sufficient thickness of copper RDL remains. If a maximum thickness of the polyimide layer or copper RDL for a particular fabrication process is limited, it may be necessary to add additional process steps to provide a double thickness of polyimide and a double thickness of copper RDL.

FIGS. 8A to 8F show schematic cross-sectional views to illustrate steps for fabrication of an embedded die package of a second example embodiment.

Figure 8A:
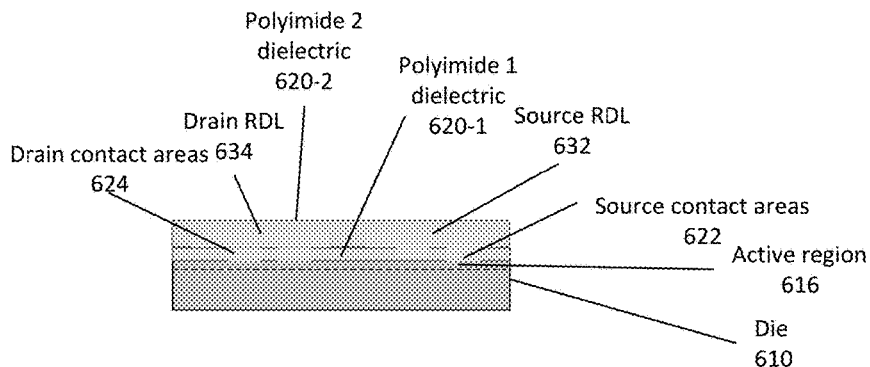
FIGS. 8A to 8F show schematic cross-sectional views to illustrate steps for fabrication of an embedded die package of a second example embodiment.

FIG. 8A shows a schematic cross-sectional view 800-1 of a power semiconductor die 610 comprising a source contact area 622, drain contact area 624 on the active region 616 of the die. In post-processing of the die, prior to embedded die packaging, a first polyimide layer 620-1 is provided on the die, contact openings are made in the first polyimide layer 620-1 and plated copper RDL is provided and patterned to provide a source contact area 632, a drain contact area 634, and gate contact areas (not shown in this view). Then, a protective dielectric layer, e.g. a second polyimide layer 620-2, is provided over the top of the die, covering the copper RDL contacts.

Figure 8B:
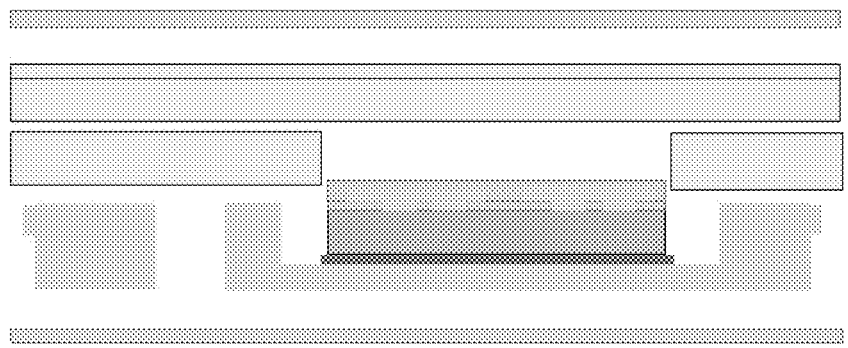

FIG. 8B shows a schematic cross-sectional view 800-2 of the layup of layers of the bottom-cooled embedded die package of a second example embodiment, prior to lamination.

Figure 8C:
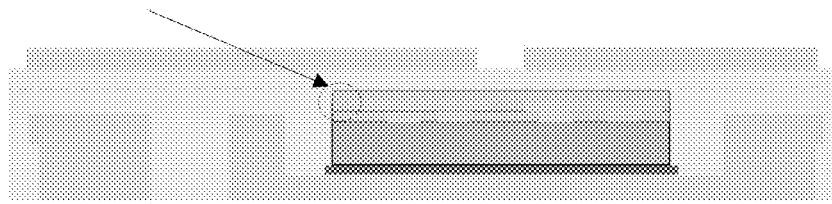

FIG. 8C shows a schematic cross-sectional view 800-3 of layers of the bottom-cooled embedded die package of the second example embodiment, after lamination. During lamination the protective dielectric layer 620-2 protects the die edges, e.g. the thickness of dielectric layer 620-2 is thick enough to provides cushioning from pressure applied during the lamination process. For example, the protective dielectric layer 620-2 may be a polyimide dielectric having suitable mechanical properties to act as a cushioning layer. The polyimide dielectric may be a polyamideimide.

Figure 8D:
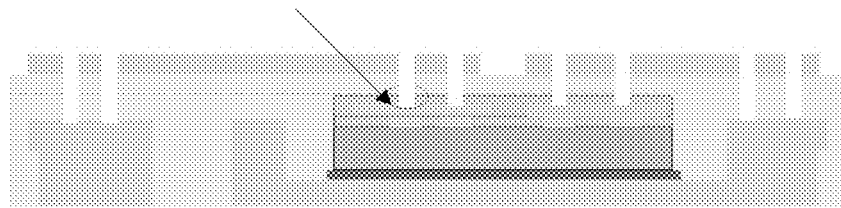

FIG. 8D shows a schematic cross-sectional view 800-4 after laser drilling of vias. The additional thickness of protective dielectric layer 620-2 also helps to protect the copper RDL from laser drilling damage. For example, if the vias are drilled with a $CO_2$ laser of a wavelength and energy that removes the glass fiber and epoxy dielectric, the protective dielectric layer 620-2 is also removed by the $CO_2$ laser, to expose the Cu RDL. Since the surface of the Cu RDL is protected by layer 620-2 during the leadframe surface roughening etch process, the exposed surface of the Cu RDL at the bottom of the via remains smooth.

Figure 8E:
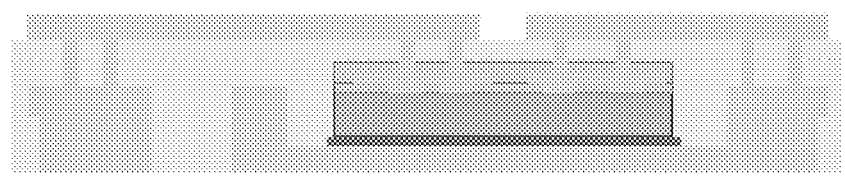
Figure 8F:
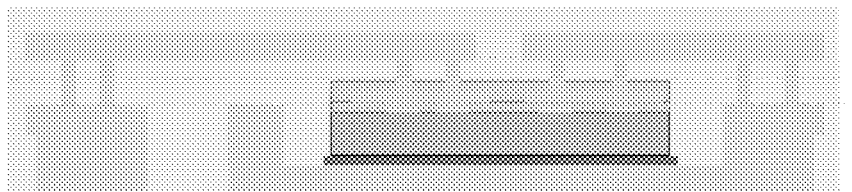

FIG. 8E shows a schematic cross-sectional view 800-5 of layers of the bottom-cooled embedded die package of the second example embodiment, after vias are filled with conductive metal, e.g. plated copper which fills the laser drilled vias and builds-up thickness of the copper foil. FIG. 8F shows a schematic cross-sectional view 800-6 of layers of the bottom-cooled embedded die package of the second example embodiment, after vias are filled with conductive metal and a top dielectric layer is provided. The top dielectric layer may be another dielectric build-up layer (prepreg), a layer of solder resist, or a dielectric build up layer and a layer of solder resist.

FIGS. 9A and 9B show schematic enlarged cross-sectional views of part of the embedded die package of the first embodiment before and after embedding, and laser drilling of a via. As illustrated schematically in FIG. 9A, because the Cu RDL is exposed to the leadframe surface roughening etch the copper surface is thinned and roughened. After lamination and laser drilling of vias, as illustrated schematically in FIG. 9B, there is increased risk of overdrilling because the copper surface is thinned and roughened, which may adversely affect its optical properties, potentially creating overheating and thermal damage to the underlying active area of the die. Adverse effects of thermal damage during laser drilling are exacerbated for a die comprising an E-mode lateral GaN HEMT, which has a small thermal mass and wherein the active region of the die is under the contact areas of the die where vias are being drilled. Careful control of the laser drilling process is required to mitigate these issues. During operation, a high voltage/high current E-mode lateral GaN HEMT is subject to thermal cycling and high operational temperatures, e.g. ≥75 C or ≥75 C, and the embedded die package is provided with a thermal pad on at least one side of the package, which may be mounted on a heatsink for effective thermal dissipation during operation.

FIGS. 10A and 10B show schematic enlarged cross-sectional views of part of the embedded die package of the second embodiment before and after embedding, and laser drilling of a via. As illustrated schematically in FIG. 9A, because the Cu RDL is masked by the protective dielectric layer, e.g. the second layer of polyimide (PI2), the Cu RDL is protected from the leadframe surface roughening etch. After lamination and laser drilling of vias, as illustrated schematically in FIG. 9B, there is reduced risk of overdrilling and thermal damage because the copper RDL layer is not thinned, and the surface of the Cu RDL remains smooth. The protective dielectric layer is a material, such as polyimide, that provides good adhesion to the Cu RDL and the dielectric material of the package body.

Figure 11:
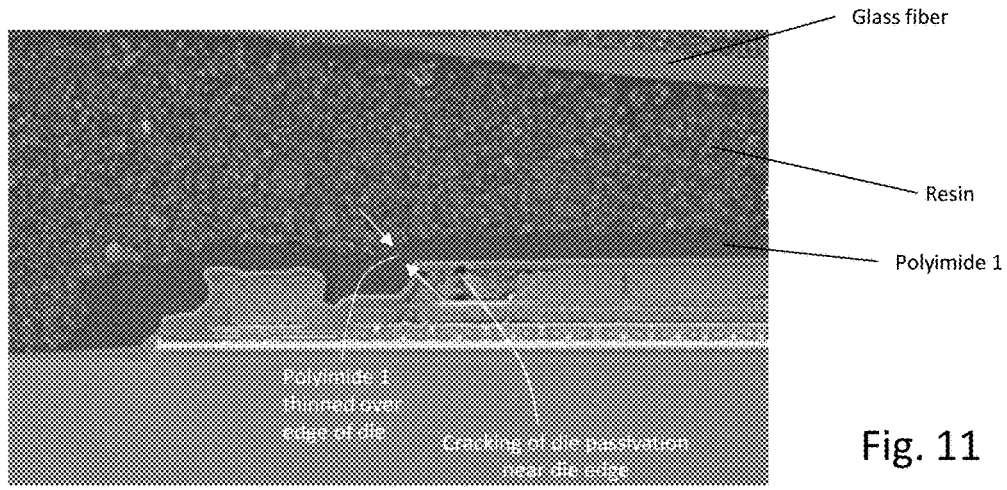
FIG. 11 shows an electron micrograph of a cross-section of part of an example embedded die package.
Figure 12:
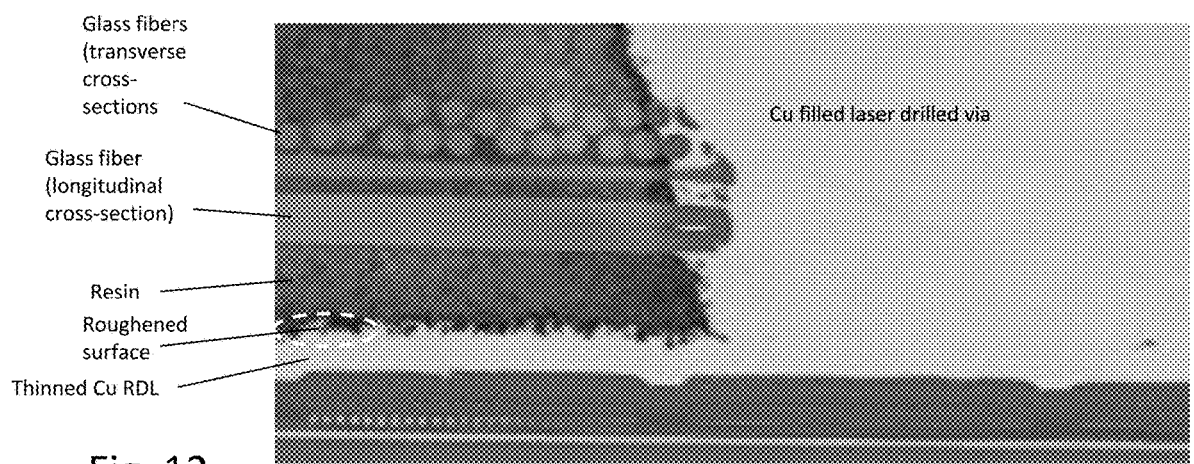
FIG. 12 shows an electron micrograph of a cross-section of another part of the embedded die package of FIG. 11.

As an example, FIG. 11 shows an electron micrograph of a cross-section of part of an embedded die package of a first embodiment to illustrate that where an insufficient thickness of the first layer of polyimide (Polyimide 1) is provided over edges of the die, cracking of the die passivation near edges of the die may occur. FIG. 12 shows an electron micrograph of a cross-section of another part of the embedded die package of FIG. 11 to illustrate thinning and surface roughening of the Cu RDL to improve adhesion between resin of the prepreg dielectric material and the Cu RDL.

Figure 13:
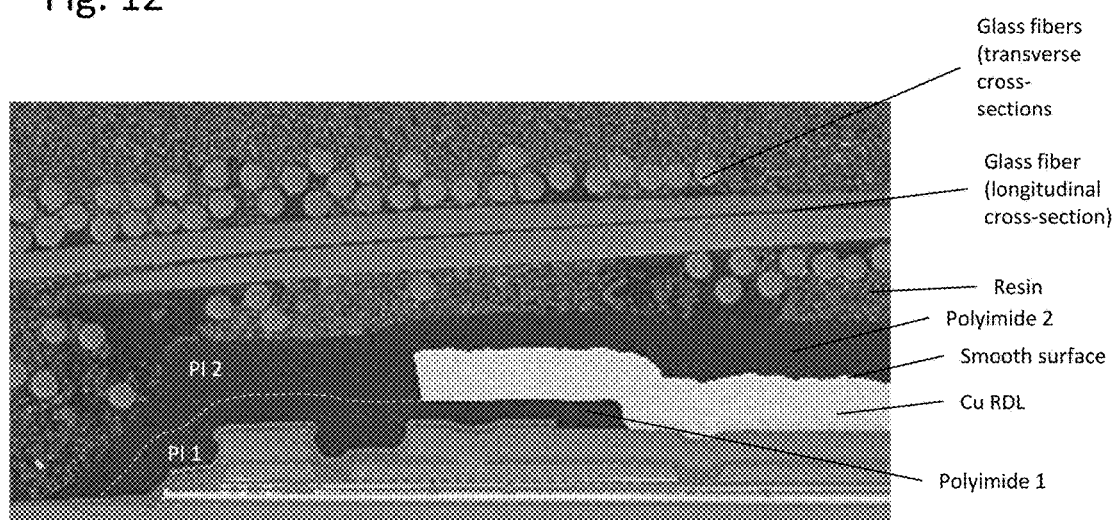
FIG. 13 shows an electron micrograph of a cross-section of part of an embedded die package of another example, wherein a protective dielectric layer is provided on the power semiconductor die prior to embedding.

FIG. 13 shows an electron micrograph of a cross-section of part of an embedded die package of an example embodiment wherein a protective dielectric layer, e.g. a second polyimide layer (labelled polyimide 2), is provided on the power semiconductor die prior to embedding. The surface of the Cu RDL is smooth because it is masked and protected during the leadframe roughening etch. The combined thickness of Polyimide 1 and Polyimide 2 provides a protective region, which acts as a cushioning layer, around the periphery of the die, particularly at the corners and edges of the die.

Figure 14:
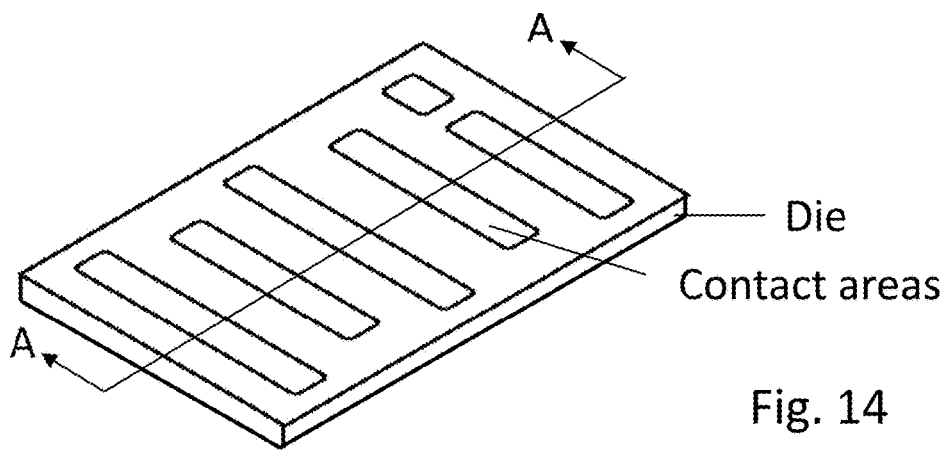
FIG. 14 shows a schematic isometric view of a power semiconductor die of a third example embodiment.
Figure 15:
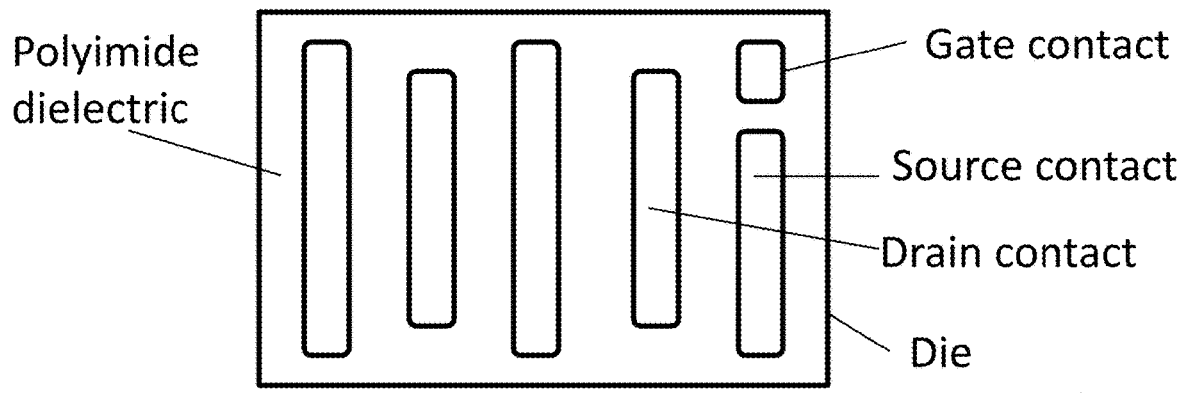
FIG. 15 shows a schematic plan view of the power semiconductor die of the third example embodiment.
Figure 16:
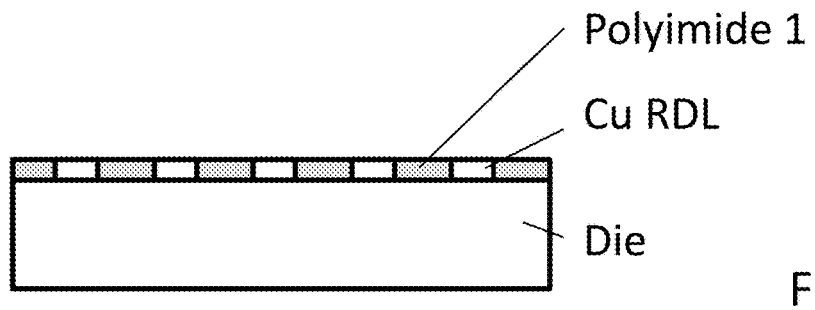
FIG. 16 shows a schematic cross-sectional view of the power semiconductor die of the third example embodiment.
Figure 17:
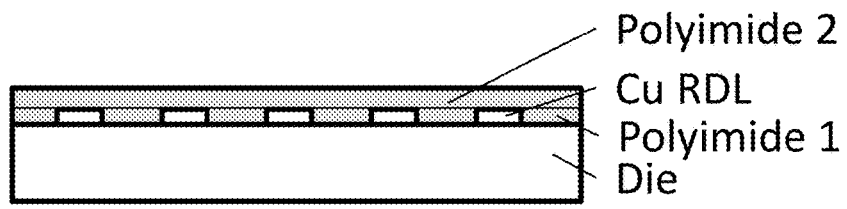
FIG. 17 shows a schematic cross-sectional view of the power semiconductor die of the third example embodiment with a protective dielectric layer.
Figure 18:
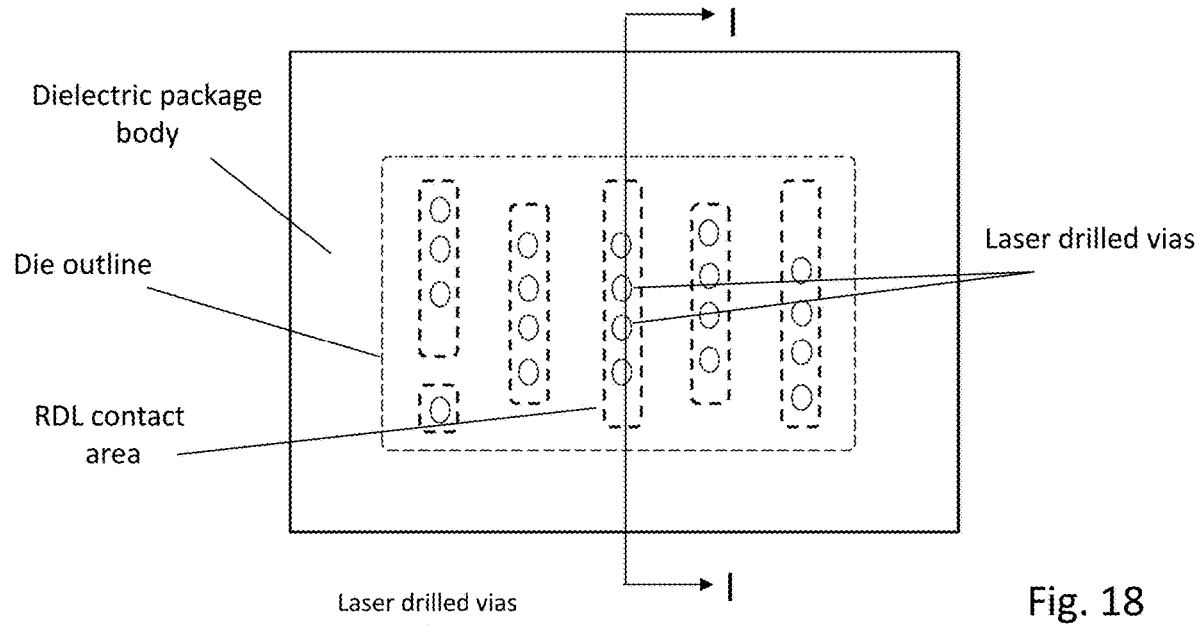
FIG. 18 shows a schematic plan view of the power semiconductor die of the third example embodiment after embedding and laser drilling of vias.

FIG. 14 shows a schematic isometric view of a power semiconductor die of a third example embodiment. FIG. 15 shows a schematic plan view of the power semiconductor die of the third example embodiment. FIG. 16 shows a schematic cross-sectional view of the power semiconductor die of the third example embodiment after providing a first polyimide layer and forming Cu RDL contacts. FIG. 17 shows a schematic cross-sectional view of the power semiconductor die of the third example embodiment after providing protective dielectric layer comprising a second polyimide layer. FIG. 18 shows a schematic plan view of the power semiconductor die of example embodiments after embedding and laser drilling of vias.

Figure 19:
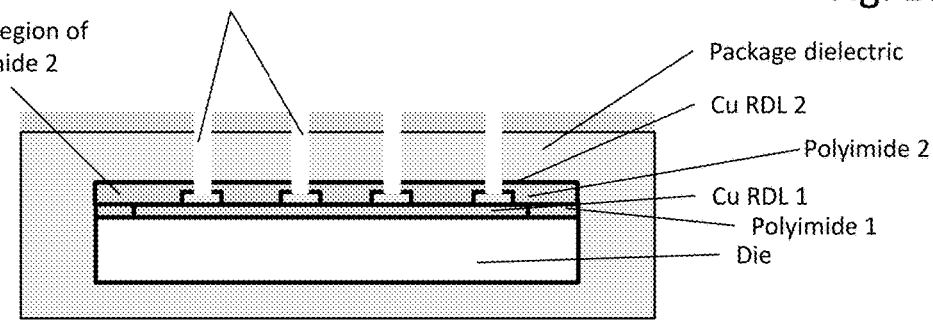
FIG. 19 shows a schematic cross-sectional view of an embedded die package of a fourth example embodiment.
Figure 20:
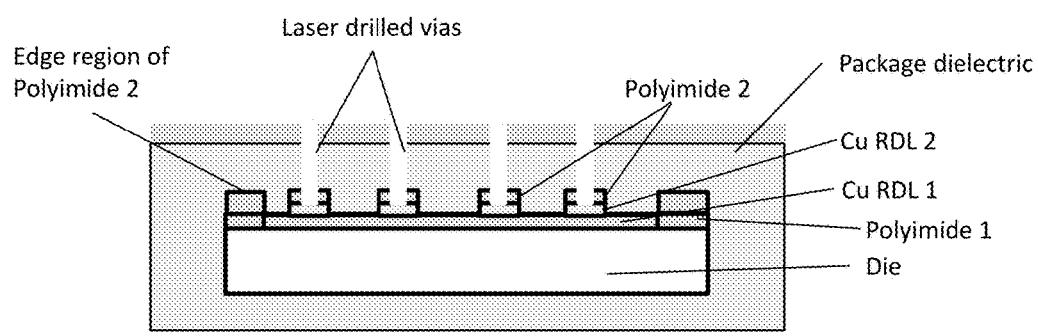
FIG. 20 shows a schematic cross-sectional view of an embedded die package of a fifth example embodiment.

FIG. 19 shows a schematic cross-sectional view through section I-I of FIG. 18 for an embedded die package of a fourth example embodiment, after embedding and laser drilling. FIG. 20 shows a schematic cross-sectional view through section I-I of FIG. 18 for an embedded die package of a fifth example embodiment, after embedding and laser drilling. As illustrated schematically in FIG. 19 and FIG. 20, the embedded die packages of the fourth and fifth embodiments are variants which comprise two copper RDL layers, RDL1 and RDL2, and two layers of polyimide dielectric, Polyimide 1 and Polyimide 2. The second RDL (RDL2) is selectively provide in areas where laser drilled vias are provide, to add an additional thickness of copper to mitigate overdrilling and thinning of the RDL at the bottom of the vias. The second polyimide layer extends around edges of the die to provide a cushioning layer of a sufficient thickness to protect edges of the die during the lamination process. As illustrated schematically in FIG. 19, the second polyimide layer Polyimide 2 is provided as a blanket layer over the entire area of the die, masking the Cu RDL 2 contact areas. Optionally, as illustrated schematically in FIG. 20, the second polyimide layer Polyimide 2 is provided around the edge region of the die and provided selectively on Cu RDL 2 contact areas. Selective masking of the Cu RDL contact areas may reduce stress in the polyimide layer across the die. For the embedded die packages of the embodiments shown in the schematic cross-sectional views in FIGS. 17, 19 and 20, the thicknesses of the first and second polyimide layers is e.g. ≥5 µm, to provide a protective region having a combined thickness of e.g. ≥10 µm around the periphery of the die; the polyimide material is a material that is compressible, or resiliently compressible, to act as a cushioning layer during lamination. Where the polyimide layer provides a masking layer on the Cu RDL contact areas, it should be etch-resistant to a copper surface roughening etch used for surface roughening of the leadframe to promote adhesion of the dielectric material of the package body. The polyimide material is selected to have good adhesion to the Cu RDL contacts and the dielectric material of the package body, so that the polyimide material functions as an adhesion layer between the Cu RDL and the dielectric material, e.g. epoxy resin composite of the package body. For example, the polyimide material may be a polyamide imide.

Polyimide type dielectrics that are provided by spin-coating and curing process can a provide uniform coverage and thickness on smoother surface device topologies, e.g. for device structures that use thicker dielectric layers and planarization processes such as chemical-mechanical polishing. For device structures with less uniform surface topologies, spin coating over stepped edges and trenching may result in thinning of the polyimide layer over edges of stepped structures and trenches. For example, even if a nominal polyimide coating thickness is 5 µm, polyimide coverage over some areas of device structures may be significantly thinner, e.g. 2.5 µm. In a conventional process flow, using a single layer of polyimide and a single layer of Cu RDL, if the maximum thickness of polyimide dielectric layer and Cu RDL layer of a process flow is limited, e.g. 5 µm of polyimide and 8 µm of Cu RDL, in the resulting device structure, the polyimide layer may be thinner over edges, and the Cu RDL may be thinned during the surface roughening etch to promote adhesion of package dielectric.

By using a double polyimide process as disclosed herein, the thickness of polyimide around the periphery of the die can be increased to provide a protective region or ring around edges and corners of the die, which functions as a cushion during the lamination process. By providing the protective second dielectric layer, e.g. a second polyimide layer, after defining the Cu RDL contact areas, the Cu RDL is masked and protected during a leadframe surface roughening etch. The additional protective dielectric layer encapsulating the Cu RDL contact areas protects against oxidation of the Cu RDL contact areas during storage before embedded die packaging. For power switching devices structures subject to high electric fields during operation, e.g. high voltage/high current lateral GaN HEMTs, an additional protective dielectric layer encapsulating the Cu RDL contact areas also assists in reducing the risk of Cu metal ion migration into the package dielectric, during operation, which may potentially cause electrical shorts.

For further details regarding laser drilling masks, reference is made to related to U.S. patent application Ser. No. 17/945,231, filed Sep. 15, 2022, entitled "Fabrication of Embedded Die Packaging comprising Laser Drilled Vias", which is a continuation-in-part of U.S. patent application Ser. No. 17/065,886, filed Oct. 8, 2020, entitled "Fabrication of Embedded Die Packaging comprising Laser Drilled Vias".

Embedded die packaging of some example embodiments comprising leadframes have been described. In other embodiments the embedded die packaging may be non-leadframe embedded die packaging wherein a laminated body of the package comprises a plurality of dielectric layers and conductive layers.

Embedded die packaging of power semiconductor devices for automotive applications is required to survive harsher conditions, e.g. to achieve a MSL1 rating. Power semiconductor switching devices for high-voltage and high-current operation for automotive applications may result in higher operational temperatures, e.g. ≥75 C or ≥100 C, and more extreme thermal cycling. A mismatch of coefficient of thermal expansion between conductive metal layers of the leadframe and the epoxy composite dielectric layers of an embedded die package may lead to cracking and delamination caused by thermal cycling. These effects tend to be exacerbated in multi-layer layups with three or more metal layers and dielectric layers. For glass fiber containing prepreg dielectric materials, the glass fibers may be stressed during pressing and curing for the lamination process. For example, contact points of the ends of glass fiber strands and the metal leadframe may be particular points of stress, from which cracking and/or delamination may be initiated. For example, for harsher conditions, e.g. automotive applications, embedded die packaging may be required to pass temperature cycling of 1000 cycles from −55 C to 175 C and to meet requirements for MSL1. Other tests may include high temperature and high humidity, high reverse bias testing, aka "H3TRB" testing. During this type of test, issues related to ion migration, e.g. copper migration in regions subject to high electric field, may be detected. An additional protective dielectric layer encapsulating the copper RDL reduces the risk of metal ion migration which may cause electrical shorts. For example, copper RDL may react with e.g. chloride ions in the prepreg dielectric, which may result in copper ion migration between the copper RDL and source/substrate and drain regions.

While embodiments of embedded die packaging for a power semiconductor device are described in detail with reference to a power semiconductor device comprising a GaN semiconductor power transistor, a power semiconductor device may comprise a GaN diode. The power semiconductor device may comprise a plurality of GaN power transistors, a plurality GaN power diodes, a combination of at least one GaN power transistor and at least one power diode. For example, the die may comprise a power semiconductor device which comprises a plurality of GaN transistors configured as one of: a half-bridge, a full-bridge, and other switching topologies. The die may comprise other components, integrated with the power semiconductor device, e.g., one or more of driver circuitry, control circuitry, sensors, passive components, et al., The power semiconductor device may be co-packaged and interconnected with other components, such as a driver chip, embedded in the package.

Embedded die packages of exemplary embodiments are described herein, wherein the power semiconductor device comprises a GaN power transistor device, such as at least one high voltage, high current GaN HEMT, which is described as having first and second contact areas which are referred to as source and drain contact area, and a third contact area which is described at a gate contact area. Embedded die packing of these embodiments are also applicable for embedded die packaging of GaN power diodes, in which the first and second contact areas would be referred to as anode and cathode contact areas, instead of source and drain contact areas.

For example, the power semiconductor device may comprise at least one power transistor, at least one power diode, a combination of at least one power transistor and at least one power diode, fabricated using GaN semiconductor technology or other III-Nitride technology.

Examples of suitable dielectric materials for the core and build-up layers of the laminated package body are described in related patent applications cited herein. For example, dielectric build-up layers comprise any one of: a glass-fiber reinforced resin composition; a glass-fiber reinforced epoxy resin composition; a dielectric resin build-up layer; a dielectric epoxy build-up layer; a build-up layer which is formed from an ABF (Ajinimoto Build-up Film); and a combination thereof. The dielectric build-up layer may be a vacuum laminated dielectric. For example, a vacuum laminated reinforced dielectric underlying the solder resist may be formed from an epoxy prepreg or a sheet of an epoxy resin composition comprising filler particles, known as a BUF (build-up film).

The laminated body may comprise a layer stack which is symmetric or asymmetric, and is configured with at least one of a top-side and a bottom side thermal pad. The core and dielectric build-up layers may comprise a dielectric epoxy composition having an FR4 epoxy composition, such as Panasonic R1577 or Hitachi E679 or other composition having similar electrical and mechanical characteristics. The dielectric build-up layers may comprise a BUF polymer composition such as Sekishi NX04H, N!07, NQ07X or NR10.

In exemplary embodiments, the conductive metallization layers of the embedded die packaging are described as comprising copper, e.g. plated copper. In other embodiments, any suitable metal, for example Cu, Al, Ni, Sn, Au, Ag, Pt, Pd, and an alloy of one or more of these metals, compatible with the selected semiconductor technology, may be used. Each of the metallization layers defining contact areas and interconnect traces may comprise a single layer or a plurality of layers of conductive materials.

More generally, for example, the power semiconductor device may comprise one of: a power transistor, a power diode, and a combination of a power transistor and a power diode. The power semiconductor device may comprise one or a plurality of transistors, one or a plurality of diodes, a combination of at least one transistor and at least one diode. For example, the power semiconductor device may comprise a plurality of power transistor switches configured as a half-bridge, full-bridge, or other switch topology. The power transistor switches may be integrated on a single die, or configured by embedding multiple die in an embedded die package. A power semiconductor device such as a transistor device or power diode device, or power switching device, may comprise other components, e.g. integrated driver and/or control circuitry, sensors, and/or other active or passive components.

In the forgoing description, any references to color elements in the drawings refer to the color version of the drawings, i.e. the drawings that were submitted as non-black and white line drawings, and stored for access as supplemental material in the USPTO SCORE database.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A method of post-processing a semiconductor die comprising a GaN semiconductor power switching device prior to embedded die packaging comprising:
   providing the semiconductor die comprising a patterned layer of conductive metallization on a front-side of the die providing electrical contact areas of the power switching device comprising a source contact, a drain contact and a gate contact;
   providing a first dielectric layer extending over the front-side of the die;
   defining contact openings through the first dielectric layer to electrical contact areas of the power switching device;
   providing a conductive metal redistribution layer on the first dielectric layer extending through the contact openings of the first dielectric layer;
   patterning the conductive metal redistribution layer to provide a source contact area, a drain contact area and a gate contact area; and
   providing a protective second dielectric layer extending over the first dielectric layer and the source contact area, drain contact area and gate contact area of the conductive metal redistribution layer;
   the protective second dielectric layer masking each of the source contact area, drain contact area and gate contact area of the conductive metal redistribution layer, and the protective second dielectric layer extending to edges of the die to form a protective region extending around a periphery of the die.

2. The method of claim 1, wherein the protective second dielectric layer comprises a polyimide material having a thickness and mechanical properties whereby the protective region extending around the periphery of the die is configured to act as a cushion during embedded die packaging.

3. The method of claim 1, wherein the protective second dielectric layer is provided as a blanket layer over the front-side of the die.

4. The method of claim 1, wherein the protective second dielectric layer is provided selectively on the front-side of the die to define said protective region extending around the periphery of the die, and to mask each of the source contact area, drain contact area and gate contact area of the conductive metal redistribution layer.

5. A semiconductor device structure comprising:
   a die comprising a GaN semiconductor power switching device having a patterned layer of conductive metallization on a front-side of the die providing electrical contact areas of the semiconductor power switching device comprising a source contact, a drain contact and a gate contact;
   a first dielectric layer extending over the front-side of the die;
   contact openings through the first dielectric layer to said source, drain and gate contact areas of the semiconductor power switching device;
   a conductive metal redistribution layer formed on the first dielectric layer extending through the contact openings of the first dielectric layer;
   the conductive metal redistribution layer being patterned to provide a source contact area, a drain contact area and a gate contact area; and
   a protective second dielectric layer extending over the first dielectric layer and the source contact area, drain contact area and gate contact area of the conductive metal redistribution layer;
   the protective second dielectric layer masking each of the source contact area, drain contact area and gate contact area, and the protective second dielectric layer extending to edges of the die to form a protective region extending around a periphery of the die.

6. The semiconductor device of claim 5, wherein the protective second dielectric layer comprises a polyimide material having a thickness and mechanical properties whereby the protective region extending around the periphery of the die forms a cushion during embedded die packaging.

7. The semiconductor device structure of claim 5, wherein the protective second dielectric layer is provided as a blanket layer over the front-side of the die.

8. The semiconductor device structure of claim 5, wherein the protective second dielectric layer is provided selectively on the front-side of the die to define said protective region extending around the periphery of the die, and to mask each of the source contact area, drain contact area and gate contact area of the conductive metal redistribution layer.

9. A method of leadframe embedded die packaging of a semiconductor die comprising a GaN semiconductor power switching device comprising:
   providing the semiconductor die comprising a patterned layer of conductive metallization on a front-side of the die providing electrical contact areas of the GaN semiconductor power switching device comprising a source contact, a drain contact and a gate contact;
   providing a first dielectric layer extending over the front-side of the die;
   defining contact openings through the first dielectric layer to electrical contact areas of the power switching device;
   providing a conductive metal redistribution layer on the first dielectric layer extending through the contact openings of the first dielectric layer;
   patterning the conductive metal redistribution layer to provide a source contact area, a drain contact area and a gate contact area;
   providing a protective second dielectric layer extending over the first dielectric layer and the source contact area, drain contact area and gate contact area of the conductive metal redistribution layer;
   the protective second dielectric layer masking each of the source contact area, drain contact area and gate contact area of the conductive metal redistribution layer, and the protective second dielectric layer extending to edges of the die to form a protective region extending around a periphery of the die;
   providing a leadframe and mounting the die on the leadframe with die attach material;
   performing a surface roughening etch on the leadframe, wherein the protective second dielectric layer is etch-resistant to the surface roughening etch;
   providing a layer stack comprising:
      the leadframe and the die mounted on the leadframe; and
      a plurality of dielectric build-up layers and at least one conductive layer;
   performing a lamination process to embed the die and at least top and side surfaces of the leadframe;
   opening vias for electrical contacts to the die by laser drilling through the dielectric build-up layers, through the at least one conductive layer, and through the protective second dielectric layer;
   filling the vias with conductive metal;
   patterning the at least one conductive layer for form source, drain and gate interconnect; and
   providing another dielectric build-up layer over said at least one conductive layer.

10. The method of claim 9, wherein the protective second dielectric layer comprises a polyimide material having a thickness and mechanical properties whereby the protective region extending around the periphery of the die is configured to act as a cushion during embedded die packaging.

11. The method of claim 9, wherein the protective second dielectric layer is provided as a blanket layer over the front-side of the die.

12. The method of claim 9, wherein the protective second dielectric layer is provided selectively on the front-side of the die to define said protective region extending around the periphery of the die, and to mask each of the source contact area, drain contact area and gate contact area of the conductive metal redistribution layer.

13. An embedded die package comprising a laminated body and a die comprising a GaN semiconductor power switching device mounted on a leadframe embedded within the laminated body, wherein:
   the die comprising the semiconductor power switching device has a patterned layer of conductive metallization on a front-side of the die providing electrical contact areas of the GaN semiconductor power switching device comprising a source contact, a drain contact and a gate contact;
   a first dielectric layer extending over the front-side of the die;

contact openings through the first dielectric layer to said source, drain and gate contact areas of the semiconductor power switching device;

a conductive metal redistribution layer formed on the first dielectric layer extending through the contact openings of the first dielectric layer;

the conductive metal redistribution layer being patterned to provide a source contact area, a drain contact area and a gate contact area;

a protective second dielectric layer extending over the first dielectric layer and the source contact area, drain contact area and gate contact area of the conductive metal redistribution layer;

the protective second dielectric layer extending over each of the source contact area, drain contact area and gate contact area, and the protective second dielectric layer extending to edges of the die to form a protective region extending around a periphery of the die;

the laminated body comprises a layer stack comprising at least one dielectric layer that embeds the die and at least top and side surfaces of the leadframe, and a first conductive layer patterned to define interconnect areas; and a plurality of electrically conductive vias extending through the first conductive layer, the at least one dielectric layer that embeds the die, and the protective second dielectric layer, the plurality of electrically conductive vias interconnecting interconnect areas of the first conductive layer and electrical contact areas of the semiconductor device.

14. The embedded die package of claim 13, wherein the protective second dielectric layer comprises a polyimide material having a thickness and mechanical properties whereby the protective region extending around the periphery of the die forms a cushion during embedded die packaging.

15. The embedded die package of claim 13, wherein the protective second dielectric layer is provided as a blanket layer over the front-side of the die.

16. The embedded die package of claim 13, wherein the protective second dielectric layer is provided selectively on the front-side of the die to define said protective region extending around the periphery of the die, and to mask each of the source contact area, drain contact area and gate contact area of the conductive metal redistribution layer.

17. The embedded die package of claim 13, wherein the protective second dielectric material comprises a polyimide material which is resistant to a surface roughening etch of the conductive metal redistribution layer and metal of the leadframe.

18. The embedded die package of claim 17, wherein the conductive metal redistribution layer and the leadframe comprise copper.

19. The embedded die package of claim 13, wherein the conductive metal redistribution layer and the leadframe comprise copper, and the protective second dielectric material comprises a polyimide material which is resistant to a surface roughening etch of the conductive metal redistribution layer and metal of the leadframe.

20. The embedded die package of claim 13, wherein the GaN semiconductor power switching device comprises at least one high voltage, high current lateral GaN HEMT rated for operation at ≥100V or >600V and for operation at a temperature ≥75 C.

* * * * *